United States Patent

[11] 3,609,640

[72] Inventors Bruce Cameron Longenecker
Harrisburg;
Charles Edward Reynolds, Camp Hill, both of Pa.

[21] Appl. No. 877,352

[22] Filed Nov. 17, 1969

[45] Patented Sept. 28, 1971

[73] Assignee AMP Incorporated
Harrisburg, Pa.

[54] PRECISION RECEPTACLE ALIGNMENT SYSTEM
8 Claims, 6 Drawing Figs.

[52] U.S. Cl. .......... 339/91 R, 339/217 S, 339/258 P

[51] Int. Cl. .......... H01r 13/54

[50] Field of Search .......... 339/17, 91, 176, 217, 221, 258, 259

[56] References Cited

UNITED STATES PATENTS

| | | | |
|---|---|---|---|
| 3,146,051 | 8/1964 | Woofter et al. | 339/91 |
| 3,487,350 | 12/1969 | Hammell | 339/217 |

FOREIGN PATENTS

| | | | |
|---|---|---|---|
| 602,636 | 5/1948 | Great Britain | 339/258 R |
| 1,122,793 | 8/1968 | Great Britain | 339/17 R |
| 1,100,657 | 1/1968 | Great Britain | 339/258 R |

*Primary Examiner*—Joseph H. McGlynn
*Attorneys*—Curtis, Morris and Safford, William J. Keating, Ronald D. Grefe, William Hintze, Adrian J. La Rue, Frederick W. Raring, Jay L. Seitchik and John P. Vandenburg

ABSTRACT: A system is disclosed which features precision alignment of receptacles having depending terminals thereon within headers adapted to receive integrated circuit components thereon. The individual header is made of a suitable insulating material and has a plurality of apertures therein, each of which has two intersecting surfaces precisely located relative to a master reference point. The receptacles have plural spring means thereon which bias the receptacle into the corner defined by the intersecting surfaces. The receptacles also have spring contact fingers at the end opposite the depending terminal for receiving posts or leads form an integrated circuit component. The header has located thereon plural latching features for positively retaining thereon an integrated circuit component.

PRECISION RECEPTACLE ALIGNMENT SYSTEM

BACKGROUND OF THE INVENTION

In the past, the mounting of integrated circuit components into a circuit involved soldering the various leads of the component, each to its respective portion of the circuit. If it were desired to remove the component from the circuit, the leads were unsoldered, all a time-consuming process not without attendant damage to the component leads. Methods subsequently were devised whereby the component was manufactured so as to be plugged into a header made of suitable insulating material, which header had accurately machined apertures therein for receiving receptacles therein which in turn received the leads of an integrated circuit component. These receptacles carried depending terminals which were received by a panel such as a printed circuit board and soldered into the various circuits thereon. This arrangement provided for quick removal and replacement of the integrated circuit component. This system worked reasonably well until a component having one or more misaligned leads was used. To accommodate a component having misaligned leads, the header was designed for loose tolerance fitting of the receptacles therein. This would solve the problem of misaligned leads in the component, but created the problem of misaligned terminals in the header to be received in holes in the panel or printed circuit board. Obviously, with a larger number of component leads, with either of the above arrangements, misaligned leads or terminals will greatly increase the force required to connect the two elements together.

Also, there has existed the problem of retaining the receptacle within the header without expensive machining of ledges or projecting portions in the header to catch corresponding projecting portions of the receptacle.

SUMMARY OF THE INVENTION

This invention relates to an interconnection system for mounting and connecting integrated circuit components in an assembly having a relatively large number of small elements.

It is an object of the present invention to provide an interconnection system wherein integrated circuit components are mounted for connection into an electrical circuit in a manner facilitating component installation and replacement. It is a further object to provide a header allowing quick locking and unlocking engagement with an electronic component. It is yet another object of the invention to provide an improved component header which can be readily made with existing manufacturing techniques to allow a precise alignment of terminal-carrying receptacle elements carried therein. A further object is to provide a terminal-carrying receptacle of a configuration that will retain itself within a component header. It is a further object to provide a terminal-carrying receptacle that will precision self-align within a component header.

These and other objects are attained and the foregoing problems overcome by a component mounting assembly including a header having terminal-carrying receptacles mounted therein. The invention provides for precision mounting of a plurality of component lead-receiving, terminal-carrying receptacles within a header containing a plurality of oversized apertures. The apertures in such header have intersecting surfaces defining a corner which are accurately machined and located relative to a master reference point either located within or outside of the dimensions of the header. The receptacle is provided with plural spring means which bias the receptacle toward the intersection of said intersecting surfaces. Such spring means additionally prevent the receptacle from being pushed out of the aperture upon insertion of a component lead therein.

The header has located adjacent its upper surface latching means for positively retaining the component mounted thereon and additionally incorporates features which facilitate orientation of the component thereon.

DESCRIPTION OF THE PREFERRED EMBODIMENT

Figures 1, 3, 4, 5, 6:
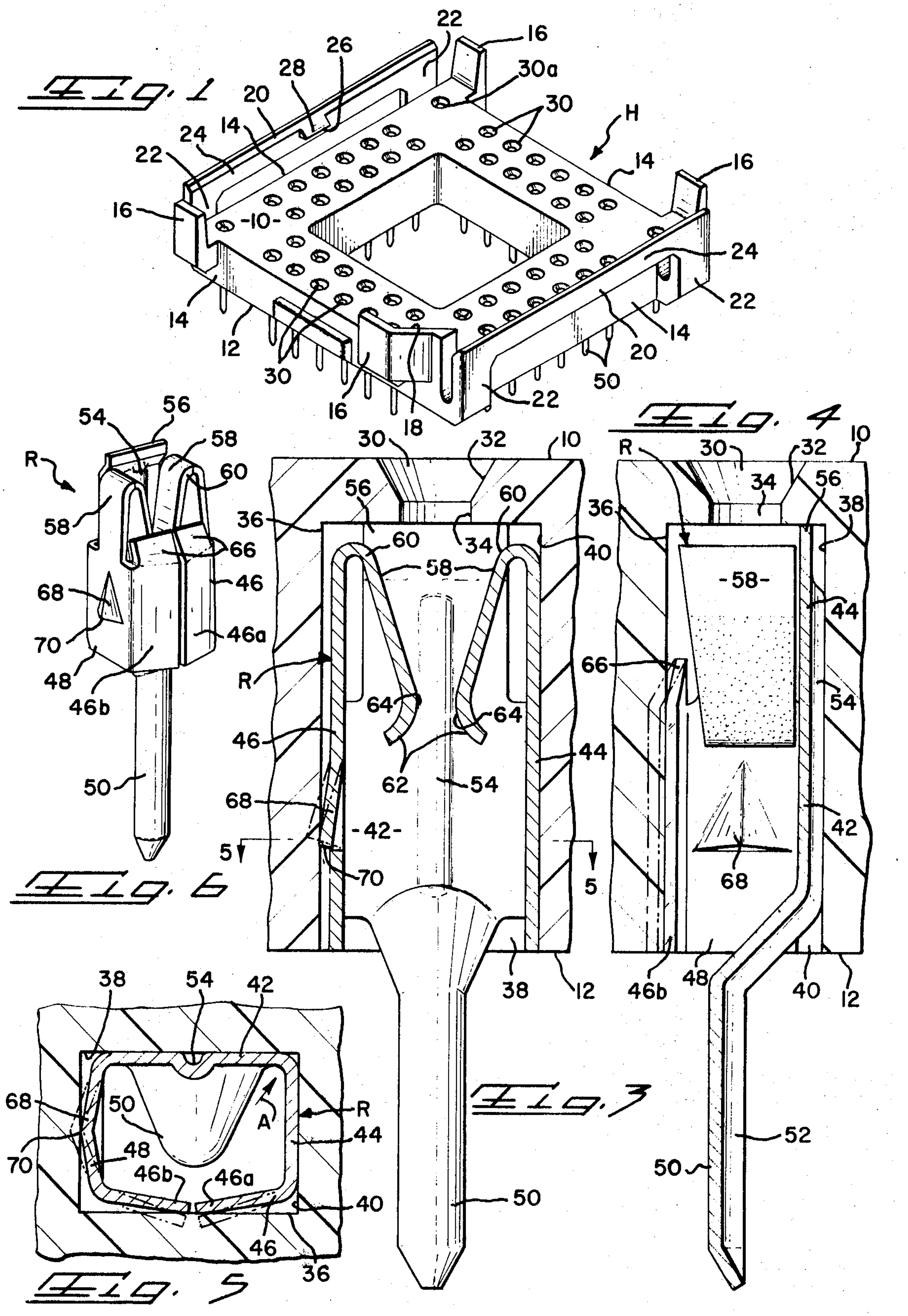
FIG. 1 is a perspective view showing the component-receiving header with terminal-carrying receptacles mounted therein.
FIG. 3 is a section view taken along line 3—3 of Figure 2 and showing a receptacle mounted within an aperture of the header.
FIG. 4 is a section view taken along line 4—4 of Figure 2 and being a view 90° rotated from Figure 3.
FIG. 5 is a section view taken along line 5—5 of Figure 3 and shows the receptacle biased toward the intersection of two sides of the aperture.
FIG. 6 is a perspective view of a receptacle in accordance with the invention.

Referring now to Figure 1, there is shown, in accordance with the present invention, a header H having a generally rectangular shape and being a one-piece molding of suitable insulating material. Header H has an upper surface 10, a lower surface 12, and four sidewall portions 14 (see Figure 2). Located on two opposite sidewall portions are upstanding retaining guides 16 to facilitate proper location of an integrated circuit component (not shown) to be mounted thereon. In conjunction with one guide 16 there is a transverse orientation face 18 (see Figure 2) to facilitate proper orientation of the component. Located on the remaining two opposed sidewall portions are two upstanding latching elements 20. Each latching element 20 comprises two leg members 22 each joining the sidewall at one end thereof and being connected together at their other ends by a transverse member 24. Each member 24 carries on its inside face a lip portion 26 which engages with a portion of a component to retain it on the header. The latching elements 20 are resilient in construction to facilitate replacement and removal of components and in this respect the upper surface 28 of lip portion 26 is slanted or sloped thereby allowing a component to slide past the lip for a snap lock engagement.

Figure 2:
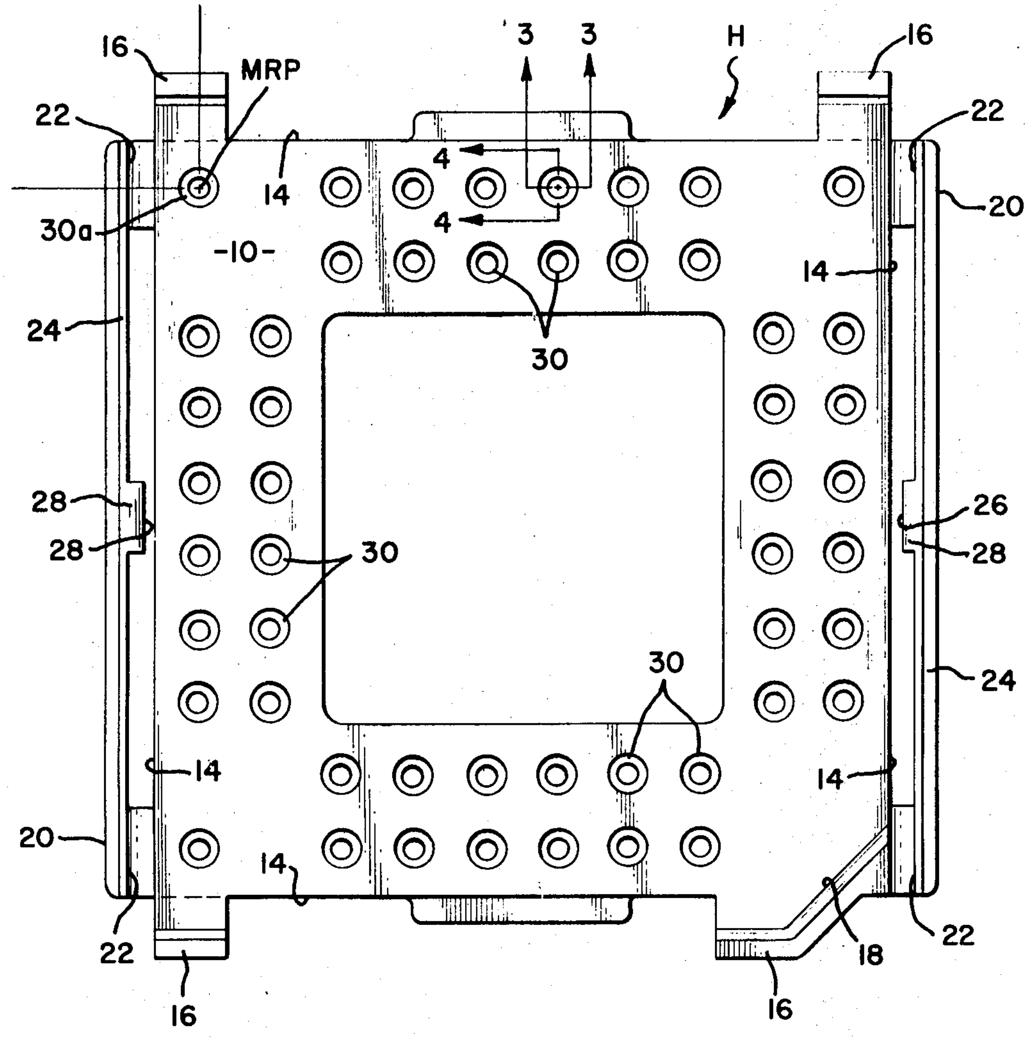
FIG. 2 is a top plan view of the header in accordance with the invention, considerably larger than actual size.

The header H, in the preferred embodiment, has 51 apertures located therein as indicated at 30. Obviously, any desired number of apertures may be located therein as required. Each aperture is comprised of a conical portion 32, a cylindrical portion 34, and a rectangular portion or cavity 36 (see FIGS. 3 and 4). In the rectangular portion 36, two adjoining or intersecting wall portions 38, 40 (see also FIG. 5) are very accurately machined and located relative to a master reference point MRP. In the preferred embodiment, the master reference point is the center of the cylindrical portion 34 of aperture **30*a*** as seen in FIG. 2. In theory, the master reference point could be any point located within or outside of the dimensions of the header H, or could be more than one point. With all apertures having two intersecting wall portions accurately machined to close tolerances and located relative to a master reference point, it is possible to accurately locate each receptacle relative to the other receptacles. In this manner, proper alignment with the plug members of the mating component is achieved resulting in minimum insertion force required to plug the component into the header.

One receptacle R, as depicted in FIG. 6, is positioned within each of the several apertures in the manner shown in FIGS. 3, 4, and 5. The receptacle R is of one-piece construction and is stamped and formed from a continuous strip of suitable conductive material. The receptacle R comprises a generally rectangular body portion (see FIG. 5) having four wall portions 42, 44, 46, and 48. As seen in FIGS. 3, 4, and 6, wall portion 42 has a downward extension forming a terminal post 50. Terminal post 50 has a concave backface 52 which forms a channel and which channel extends upwardly into, and most of the length of, wall portion 42, as seen at 54. This channel provides strength for terminal 50 and for the wall portion 42 and upper extension 56 thereof. Also, after assembly of the header system into a panel, the various terminal posts 50 will be electrically secured to circuitry on the panel by a mechanical operation such as flow soldering. During this soldering operation, any solder wicking will take place on the backface 52 of post 50 and not on the front face where solder would be drawn up into the receptacle, which is undesirable. The upper extension 56 on wall portion 42 serves as a depth control or stop member to limit insertion travel of receptacle R into aperture 30.

Contact fingers 58 extend upwardly from wall portions 44, 48, are bent inwardly and downwardly at 60 through an angle greater than 90° but less than 180°, and have their end portions 62 bent outwardly toward respective wall portions 44, 48. The amount of bend at 60 is dictated by the amount of spacing desired between contact areas 64. These contact fingers are so designed as to accept therebetween either round or rectangular plug members from a mating electronic component. The end portions 62 are bent outwardly so as to provide a stop member to prevent overstressing of the contact finger upon insertion of a large-sized plug member. That portion of the contact fingers 58 between the ends of wall portions 44, 48, and bent portions 60 is of such length so as to provide resiliency upon insertion of a plug member.

Wall portion 46 is comprised of two halves 46*a*, 46*b*, each half being an end of the blank from which the receptacle R was formed. The respective angles between wall portions 44 and 46*a*, and 48 and 46*b*, are slightly greater than 90° as can be seen in FIG. 5. The upper ends of wall portion halves 46*a*, 46*b* are bent inwardly as indicated at 66 so as to prevent interference with the sidewall of cavity 36 and assist in guiding the receptacle into the cavity upon insertion. Because of the construction of wall portion 46, the two halves 46*a*, 46*b* act as cantilever springs and bear against the respective wall of cavity 36 to urge the receptacle against machined sidewall 38. Lanced out of wall portion 48 is spring member 68 having a sharp edge 70, as seen in FIGS. 3, 5, and 6. This spring member 68 bears against the respective sidewall of cavity 36 as seen in FIGS. 3 and 5 and urges receptacle R against sidewall 40 of cavity 36. The sharp edge 70 tends to dig into the sidewall of cavity 36 thereby effectively resisting relative disassembly or disengagement as between the receptacle R and the header H. The summation of the forces of spring members 46*a*, 46*b*, and 68 urge the receptacle toward the corner or intersection of machined sidewalls 38 and 40. This summation of forces, shown by arrow A, and the unloaded spring members, shown in phantom, are depicted in FIG. 5.

In summary, the header H has 51 apertures therein, each receiving a receptacle R with each receptacle being spring biased into an accurately machined and located corner relative to a master reference point MRP. The receptacles R each have resilient contact fingers 58 for receiving an electronic component plug member, and a depending terminal post for insertion into a printer circuit panel or for individual connection to a conductor. The header H has the central portion removed for weight reduction and to allow better head dissipation from the electronic component.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

We claim:

1. In a connector assembly, a header of insulating material having at least one receptacle located therein, said header comprising upper and lower surfaces in substantially parallel relationship, said surfaces having sidewall portions therebetween, a plurality of apertures connecting said surfaces, said apertures having a rectangular cross-sectional configuration throughout a portion of their axial length with two intersecting wall portions each being positioned relative to a master reference point, said apertures having located therein a receptacle of electrically conductive material, said receptacle comprising a body member having body wall portions, upstanding resilient contact means integral with one end of said body member and being adapted to receive a plug member, depending terminal means integral with an extending from the opposite end of said body member, and plural resilient spring means integral with two of said body wall portions of said body member, the sum of the forces of said plural resilient spring means being such as to bias said receptacle toward the intersection of said two intersecting wall portions.

2. A connector assembly as set forth in claim 1 wherein said header includes latching means extending outwardly from at least one of said sidewall portions and upwardly away from said upper surface, said latching means adapted to mechanically latch to an integrated circuit member containing said plug member.

3. A connector assembly as set forth in claim 2 wherein said latching means comprises two leg members and a transverse member, said leg members each being attached at one end thereof to said one side wall portion, and being joined at the other ends thereof by said transverse member, said transverse member having located thereon a lip portion for engaging a like portion on said integrated circuit member.

4. A connector assembly as set forth in claim 3 wherein said body member is generally rectangular in cross section and wherein said plural resilient spring means are located in adjacent wall portions.

5. A connector assembly as set forth in claim 4 wherein said upstanding resilient contact means comprise at least two fingers, each finger being an extension of one of said sidewall portions and in opposing relationship, each finger being bent toward the opposing finger through an angle more than 90° and less than 180°, the free end portion of each said finger being further bent toward the sidewall portion from which said finger extends.

6. A connector assembly as set forth in claim 5 wherein said receptacle is formed from a one-piece blank and wherein the end portions of each end of said blank form a first of said body wall portions and wherein one of said plural resilient spring means comprises each end portion as a loaded cantilever with adjacent edges of said end portions abutting a first adjacent wall portion of said aperture and biasing said receptacle against one of said intersecting wall portions of said aperture.

7. A connector assembly as set forth in claim 6 wherein a portion struck from a second of said body wall portions adjacent to said one body wall portion comprises a second of said plural resilient spring means with said portion abutting against a second adjacent wall portion of said aperture and biasing said receptacle against the other of said two intersecting wall portions of said aperture.

8. A receptacle of electrically conductive material adapted to be received in a header body, said receptacle comprising body wall portions, upstanding resilient contact means adapted to receive a plug member, said means comprising at least two fingers, each finger being an upward extension of one of said sidewall portions and in opposing relationship, each finger being bent toward the opposing finger through an angle more than 90° and less than 180°, the free end portion of each said finger being further bent toward the sidewall portion from which said finger extends, depending terminal means, said terminal means being a downward extension of one of said sidewall portions, and plural resilient spring means integral with adjacent body wall portions of said body member, said body member being generally rectangular in cross section and formed from a one-piece blank having end portions, said end portions, after forming of said body member, lie in intersecting planes and form a first of said body wall portions and comprise one of said plural resilient spring means, each said end portion and respective adjacent body wall portions having an included interior angle greater than 90°, a second of said plural resilient spring means comprises a portion struck from a second of said body wall portions, and wherein said terminal means is offset from the plane of the sidewall from which it extends, said terminal means and sidewall having located in their outside surface a continuous channel terminating in said sidewall short of the upper end thereof.